United States Patent [19]
Blom et al.

[11] Patent Number: 6,026,307
[45] Date of Patent: Feb. 15, 2000

[54] ARRANGEMENT IN A COMMUNICATION SYSTEM

[75] Inventors: Tomas Blom, Sollentuna; Tommi Ravaska, Kista, both of Sweden

[73] Assignee: Telefonaktiebolaget LM Ericsson, Stockholm, Sweden

[21] Appl. No.: 08/982,315

[22] Filed: Dec. 1, 1997

[30] Foreign Application Priority Data

Dec. 2, 1996 [SE] Sweden ................................. 9604438

[51] Int. Cl.[7] .............................. H04Q 7/32; H03C 3/06
[52] U.S. Cl. ........................................... 455/553; 332/127
[58] Field of Search ................................. 455/112, 126, 455/118, 552, 553, 93, 91; 332/127

[56] References Cited

U.S. PATENT DOCUMENTS

| | | | |
|---|---|---|---|
| 4,802,235 | 1/1989 | Treatch | 455/76 |
| 4,868,523 | 9/1989 | Peterson . | |
| 4,972,455 | 11/1990 | Phillips et al. . | |
| 5,163,159 | 11/1992 | Rich et al. . | |
| 5,422,931 | 6/1995 | Austin-Lazarus et al. . | |
| 5,446,422 | 8/1995 | Mattila et al. . | |
| 5,535,247 | 7/1996 | Gailus | 375/297 |
| 5,613,226 | 3/1997 | Kanami | 455/115 |
| 5,740,521 | 4/1998 | Hulkko | 455/76 |
| 5,898,906 | 4/1999 | Williams | 455/75 |

FOREIGN PATENT DOCUMENTS 0 678 974  10/1995  European Pat. Off. .
96/10871  9/1995  WIPO .

OTHER PUBLICATIONS

Young, Paul H., "Electronic Communication Techniques", 1990, Merrill Publishing Company, pp. 444–451.

*Primary Examiner*—Curtis A. Kuntz
*Assistant Examiner*—Nick Corsaro
*Attorney, Agent, or Firm*—Burns, Doane, Swecker & Mathis, L.L.P.

[57] ABSTRACT

An apparatus transmits RF signals in two widely separated frequency bands. The RF signals in the two frequency bands have the same modulated bandwidth. The apparatus utilizes substantially the same radio communication apparatus structure as in a radio communication apparatus designed for only one frequency band. RF signals for one frequency band are obtained when a first frequency multiplier is connected, generating RF signals by multiplying VCO signals from a VCO by a factor k. The RF signals for the other frequency band are obtained from the VCO when the first frequency multiplier is not connected. When the first frequency multiplier is connected, the modulated bandwidth of the VCO signals will multiplied by the factor k. This is compensated in a phase locked loop by connecting a second frequency multiplier, having the same multiplication factor k, at the same time as the first multiplier is connected. The second multiplier affects the bandwidth of the modulated VCO signal so that it will be k times smaller. The bandwidth of the modulated VCO signal is then recreated by the first multiplier.

14 Claims, 3 Drawing Sheets

ARRANGEMENT IN A COMMUNICATION SYSTEM

The present invention relates to an apparatus for transmitting signals in different frequency bands. The invention is primarily intended to be used as a transmitter in a mobile station for two different types of cellular networks.

BACKGROUND

A call set up between a mobile station and a cellular network when the network is heavily loaded, can fail in many cases due to the fact that the cellular network has a certain upper capacity which restricts the availability of the network. Failed set-ups arise particularly in densely populated regions where call peaks appear at certain times of the day.

The coverage of mobile telephone networks vary geographically. In certain regions, the coverage can be good for one system, while the coverage may be poor for another system.

However, it is in the interest of a cellular network operator to see to it that as many call set-ups as possible succeed. For that reason, many operators of cellular networks desire that it should be possible to use one and the same mobile station for calls in a plurality of cellular networks. These networks can be built up by different types of mobile telephone systems which, for example, can imply that the two systems have different carrier frequencies, which is the frequency that is used upon radio communication between a mobile station and the mobile telephone network. These different types of cellular networks can be supplied by one and the same operator or by different operators. If the possibility exists, always to be able to choose the best network from for example the mobile station, a user can increase his or her availability towards the network, which also implies that more calls can be set up.

Mobile stations usable in several cellular networks built up by means of different mobile telephone systems necessitate in principle a transmitter and a receiver for each of the mobile telephone systems. In order for the mobile station not to become too big, it is required that the same type of components is used for the different systems to such a large extent as possible. This leads to being fewer components being included in the mobile station which means that the mobile station will be cheaper, smaller and lighter.

European patent application EP-678 974 A2 discloses a transmitter and a receiver for radio frequency systems. The transmitter and the receiver are intended to be used for transmission and reception within two different frequency ranges. Common to the transmitter and the receiver is a voltage controlled crystal oscillator which generates a mixer signal LO3 having a frequency equal to 26 MHz. Moreover, two synthesizers are connected to the voltage controlled crystal oscillator. They each generate a mixer signal LO1 and LO2, respectively, by means of the mixer signal LO3 received from the crystal oscillator. The first synthesizer generates the mixer signal LO1 at different frequencies depending on which frequency range is to be transmitted and received. For GSM, the frequency of LO1 is within the 1500 MHz range and for PCN, the frequency of LO1 is within the 1200 MHz range. The synthesizer that generates LO1 comprises two voltage controlled oscillators (VCO) in order for the mixer signal LO1 to be delivered across the interval 1200–1500 MHz with sufficient accuracy. The synthesizer that generates LO2 comprises one VCO. Thus, this apparatus comprises three VCOs.

In the transmitter, the I-signal and the Q-signal from the base band unit are I/Q-modulated with a predetermined frequency. This frequency is the mixer signal LO2 divided by a factor N. For GSM, N is equal to one, and for PCN, N is equal to two. The I/Q-modulated signal obtained, is then mixed with LO1, whereby an RF signal is obtained. The frequency content of the RF signal is dependent upon the magnitude of LO1. For GSM, an RF signal within the 900 MHz range is obtained and for PCN, an RF signal within the 1900 MHz range is obtained. Depending upon the frequency range of the RF signal, the RF signal is supplied to different RF parts via a switch. The GSM system has an RF part comprising an RF filter, an RF power amplifier and a duplex filter. The RF part of PCN comprises the same type of components but adapted to the 1900 MHz range.

A disadvantage with this solution is that the apparatus comprises three VCOs in order to be able to create mixer frequency signals that are sufficiently accurate.

Another disadvantage is that the apparatus uses two different RF filters dimensioned for the respective frequency range for filtering the RF signal before transmission.

EP 631 400 A1 discloses a solution for a dual band radio communication device intended for a satellite-based network and a land-based network. The satellite-based system transmits signals within the frequency range 1610–1625.5 MHz and receives signals within the range 2485.5–2500 MHz. The corresponding frequency range for the land-based system is 1710–1785 MHz upon transmission and 1805–1880 MHz upon reception. In a transmitter part in the device, an I/Q-modulator is used for modulating an I-channel and a Q-channel from the base band part of the device. A VCO is connected to the I/Q-modulator to generate an RF signal which is amplified, filtered and then transmitted into the air via an antenna. Due to the fact that the frequency ranges of the RF signal transmitted by the two systems are close to each other in the frequency plane, one and the same VCO can be used in the transmitter part.

A disadvantage of this transmitter part is that the frequency ranges of the transmitted signals have to be close to each other.

A common solution when transmitting in an upper and a lower frequency band is to provide a multiplier having a suitable multiplication factor in the RF part of a transmitter. When RF signals in the upper frequency band are to be transmitted, the multiplier is connected. Then, RF signals are obtained in the upper frequency band in correspondence to RF signals in the lower frequency band multiplied by the multiplication factor.

A disadvantage of this solution is that the modulation bandwidth of the RF signals in the upper frequency band increases relative to the modulation bandwidth of the RF signals in the lower frequency band. This is not acceptable if RF signals are to be transmitted in radio systems having the same channel separation.

SUMMARY

The present invention attacks a problem of how, by means of a radio communication device comprising only two voltage control oscillators (VCOs), to produce RF signals within a first frequency band having a certain centre frequency and a second frequency band having another centre frequency, where the second centre frequency is essentially twice as high as the first centre frequency without doubling the modulation bandwidth associated with the second center frequency.

The problem, then, is that upon doubling of one centre frequency, also its associated modulated bandwidth is doubled, which is undesirable.

Thus, if one, for transmitting RF signals in two widely separated frequency bands, wants to use essentially the same radio communication device structure as is used in a radio communication device intended for only one frequency band, difficulties to process the second multiplied frequency band will arise.

A further problem that the present invention attacks is how to maintain the modulation bandwidth of the transmitted RF signal upon a halving of the frequency of an RF signal, i.e. how to maintain the modulation bandwidth associated with the halved centre frequency.

Thus, an object of the present invention is to provide a radio transmitter for two separate frequency bands by means of the same transmitter design as a transmitter intended for only one band by providing only a few new units in the transmitter.

Broadly, the problem is solved by means of the following measures. Frequency signals intended for down-mixing of received RF signals in two frequency bands, which frequency signals are generated by a synthesizer, are used also upon down-mixing of the VCO frequency of a phase locked loop provided in the transmitter. A processing unit is provided in the feedback loop of the phase locked loop in order to influence the modulated bandwidth of the VCO frequency upon regulation in said loop.

Somewhat more in detail, the problems are solved in the following manner. The processing unit provided in the feedback loop of the phase locked loop, is adapted to influence a down-mixed modulated VCO frequency obtained at the down-mixing, with a constant but settable factor k. For one frequency band, the factor k is set equal to one, while for the other frequency band, the factor k is set to another value. When the down-mixed modulated VCO frequency is affected by the factor k equal to one, VCO frequencies are obtained, having the same modulated bandwidth as a modulated reference signal supplied to the phase locked loop. These VCO frequencies correspond to RF signals transmitted within the first frequency band. However, when the down-mixed modulated VCO frequency is affected by the other factor $k^11$, VCO frequencies are obtained, having a modulated bandwidth equal to the bandwidth of the reference signal divided by k. The bandwidth of the reference signal is recreated at the same time as a transformation of the VCO frequency to an RF signal in the other frequency band, is carried out.

An advantage of the multiband transmitter according to the invention is that a transmitter for transmitting in one frequency band with only minor modifications can be used as a multiband transmitter.

Another advantage is that the same base band part can be used when transmitting in a plurality of frequency bands. No resealing of the so called quadrature components from the base band part has to be carried out.

The invention will now be described more in detail by means of exemplary embodiments with reference to the appended drawing.

DETAILED DESCRIPTION

Figure 1:
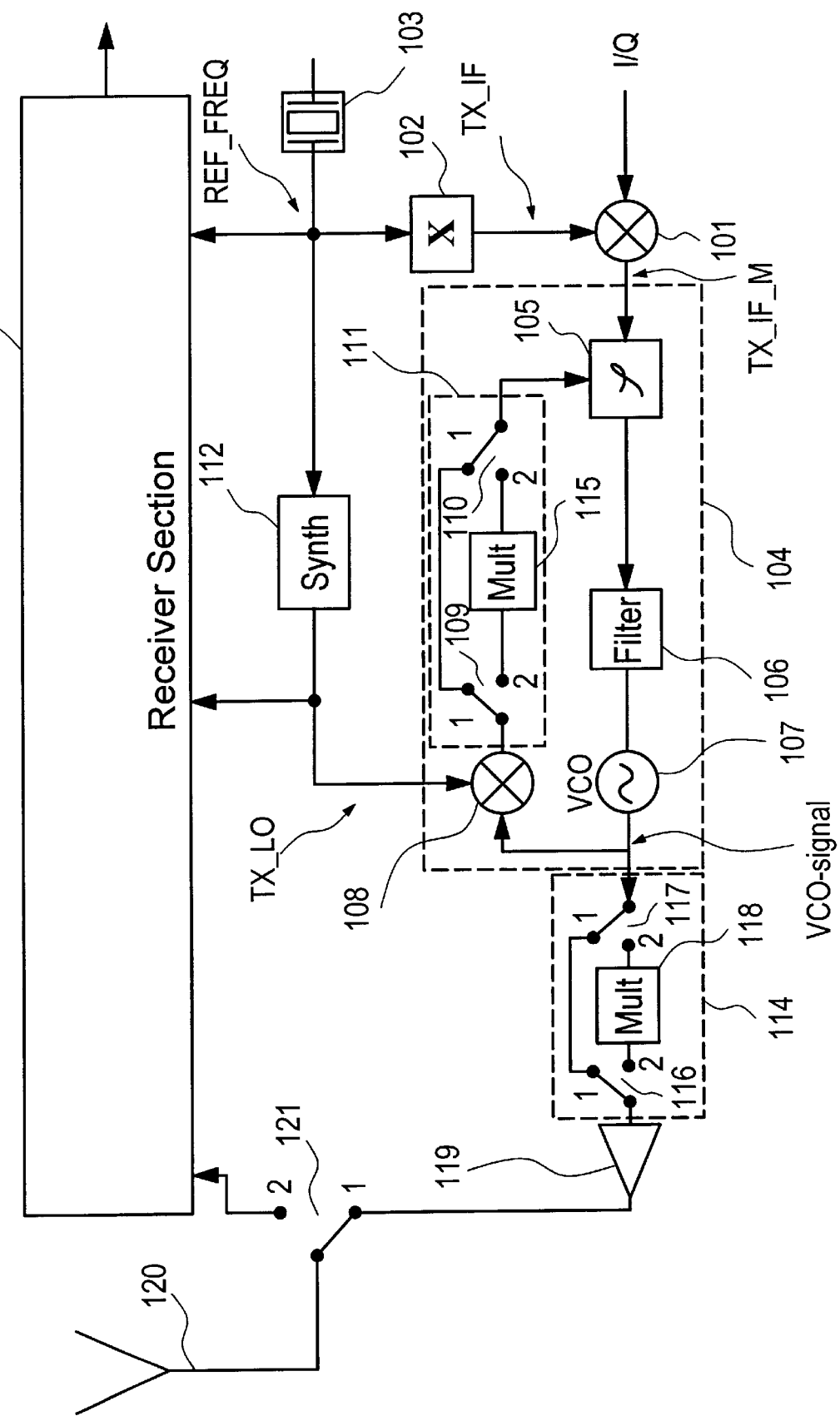
FIG. 1 is a block diagram of an embodiment of the present invention.

FIG. 1 shows a radio communication device, e.g. a transmitter/receiver device in a mobile station, which comprises an embodiment of a multiband transmitter in accordance with the invention. The radio communication device uses an antenna 120 for transmission and reception. The antenna 120 is connected to a transmitter by means of a switch 121 in a position 1 and to a receiver 113 by means of said switch in a position 2. The transmitter is adapted to transmit high frequency signals, e.g. radio frequency signals, within at least two frequency ranges. If said transmitter is adapted to transmit in a first frequency band and a second frequency band, each of said bands can e.g. correspond to a frequency band in different cellular systems. To simplify the description, it will only concern the case when the transmitter is adapted to transmit in two frequency bands.

The transmitter in accordance with the invention can advantageously be used in systems where the centre frequency of the first frequency band is essentially twice as high as the centre frequency of the second frequency band, where the same channel separation and modulation method are used. Examples of cellular systems that fulfil the above are GSM900, PCS1900 and DCS1800. GSM900 sets up calls within a frequency band 890–960 MHz, where 890–915 MHz is intended for uplink transmission and 935–960 MHz is intended for downlink transmission, while PCS uses a frequency band 1850–1990 MHz, where 1850–1910 MHz is intended for uplink transmission and 1930–1990 MHz is intended for downlink transmission.

An apparatus for transmitting in accordance with one embodiment of the invention comprises, according to FIG. 1, a phase locked loop 104, which generates modulated VCO frequencies in a predetermined RF range, can transmit RF signals in two RF ranges if a first processing unit 114, e.g. a frequency switching unit, is connected between an output of the phase locked loop 104 and an input of a power amplifier 119. The processing unit 114 generates an RF signal having a frequency corresponding to the VCO frequency multiplied by a factor k. If RF signals in two RF ranges are to be sent where the centre frequency of one band is twice as high as the centre frequency of the other band, the processing unit 114 can be implemented e.g. by means of a frequency multiplier 118 having a multiplication factor 2, and two switches 116, 117. The frequency multiplier 118 is connected by means of the two switches 116, 117 in a position 2 when the frequency band having the higher centre frequency is to be transmitted, whereby a doubling of the VCO frequency is obtained. However, if the lower frequency band is to be transmitted, the switches are in a position 1, whereby the VCO frequency is transmitted. Thus, in this example, the factor k is equal to 2 when the multiplier is connected and is equal to 1 when the multiplier 118 is not connected. However, the connection of the multiplier 118 causes the bandwidth of the other band to increase by a factor 2. If it is supposed that it is desired to transmit as one frequency band, RF signals in the frequency range 890–915 MHz, which corresponds to the uplink range for GSM, the other frequency band would be 1780–1860 MHz. This means a doubling of the bandwidth.

By analogy herewith, a doubling of the bandwidth of the modulated VCO frequency obtained from the phase locked loop 104 is obtained. In other words, besides a doubling of the frequency band of an RF signal, also a doubling of the phase deviation of the RF signal of the other frequency band is obtained in comparison with the phase deviation for the RF signals of the first frequency band. This is not desirable e.g. if the radio systems GSM900–PCS1900 or GMS900–DCS1800 are to be implemented in one and the same transmitter. Since these systems have the same channel separation, also the bandwidth of the modulated transmitted RF signal has to be the same for both systems. An intention with the present invention is to solve the problem of maintaining the bandwidth of the transmitted modulated RF signal for the two systems as used in one and the same so called dual band transmitter.

No base band part in the apparatus will be described since the base band part can be any base band part which generates two orthogonal base band signals usually denoted I-signal and Q-signal. By input signal to the multiband transmitter is, thus, meant base band signals, I/Q-signals, that have been signal processed in the base band part. It is well known to anyone skilled in the art how an I/Q-signal is generated.

The I/Q-signal within the base band range is fed to a quadrature modulator 101 in which it is mixed with a signal TX_IF of a predetermined frequency in the intermediate frequency range, whereby a modulated signal TX_IF_M in the intermediate range is obtained. The signal TX_IF is phase locked to a signal REF_FREQ obtained from a reference oscillator 103. The reference oscillator 103 is a so called crystal oscillator. The predetermined frequency of the signal TX_IF is generated by generating a frequency corresponding to a multiplication of the frequency of the signal REF_FREQ by a predetermined factor X. This can e.g. be carried out in a variable frequency multiplier. The factor X can be different upon transmission in the first and second frequency band, respectively. For the first frequency band, the factor X=9, and for the second frequency band, the factor X=12. With said factor values, the signal TX_IF is generated with the frequencies 117 MHz (9*13 MHz) and 156 MHz (12*13 MHz), respectively, from the processing unit 102. Depending on which band of RF signals is to be transmitted, the signal TX_IF is supplied with the frequency 117 MHz or with the frequency 156 MHz to the quadrature modulator 101, whereby the modulated intermediate frequency signal TX_IF_M is obtained. The mixing in the quadrature modulator 101 is carried out in a manner known per se in accordance with the I/Q-modulation principle. This is carried out by mixing the I-signal with the signal TX_IF, whereby the signal TXIF_I is obtained, and the Q-signal with TX_IF phase shifted 90°, whereby the signal TXIF_Q is obtained. These signals are added after the modulation, where a sum TXIF_I+TXIF_Q is obtained, which above and below is denoted TX_IF_M.

The modulated intermediate frequency signal TX_IF_M obtained from the quadrature modulator 101, is then supplied to a phase detector 105 in the phase locked loop 104. The signal TX_IF_M is a reference signal to the phase detector 105. The phase locked loop also comprises a loop filter 106, a voltage controlled oscillator (VCO) 107, a mixer 108 and a second processing unit 111, e.g. a frequency switching unit. The processing unit can e.g. be implemented by means of a frequency multiplier 115 having two switches 109, 110. The phase locked loop 104 is intended to mix up the signal TX_IF_M from the intermediate frequency range to a VCO signal of a predetermined frequency in an RF range. As examples, desired RF ranges for the VCO signal for GSM900 and PCS1900 can be mentioned. These ranges are 890–915 MHz and 925–955 MHz, respectively. Thus, when the signal TX_IF_M modulated with the frequency 117 MHz is fed into the phase locked loop 104, the intermediate frequency signal TX_IF_M is mixed up by means of the loop 104 to the VCO signal of a predetermined frequency in the RF range 890–915 MHz, and when TX_IF_M is modulated with the frequency 156 MHz, the corresponding is carried out to the RF range 925–955 MHz.

The phase detector 105, the loop filter 106, the VCO 107 are interconnected in series. Via the mixer 108 which mixes down the VCO signal in the RF range to a signal in the intermediate frequency range, the VCO signal is fed back to the phase detector 105 in order to obtain a regulated voltage control of the VCO 107. The mixing in the mixer 108 is carried out between the VCO signal of some frequency in the above mentioned RF ranges, and a signal TX_LO in the frequency range 1003–1033 MHz. The signal TX_LO is obtained from a synthesizer 112. This synthesizer 112 is also used upon generation of frequency signals intended for receiving RF signals in two frequency bands by means of the receiver 113. By a suitable choice of the frequency of the signal TX_LO, the VCO signal is obtained having a desired frequency. All this is carried out in accordance with a previously known method.

The other processing unit 111, which e.g. can be implemented with the frequency multiplier 115 and switches 109, 110, is connected in accordance with the invention between the mixer 108 and the phase detector 105. When the transmitter is to transmit in the first frequency band, the switches 109, 110 are in a position 1, and when the transmitter is to transmit in the second frequency band, the switches 109, 110 are in a position 2. When said switches are in position 2, the frequency multiplier 115 having the multiplication factor 2, is connected between the mixer 108 and the phase detector 105. By means of this connection, the frequency and the modulation bandwidth of the down-mixed VCO signal obtained from the mixer 108, are doubled. Thus, one now has a bandwidth that is twice the bandwidth of the reference signal. The phase locked loop 104 is a feedback controlled control loop which is controlled until there is no difference between the reference signal and the feedback signal. When the multiplier 115 is connected, the feedback signal, i.e. the multiplied modulated down-mixed VCO frequency, has the same bandwidth upon complete control as the reference signal to the phase detector 105. Consequently, the down-mixed VCO frequency gets half the bandwidth of the reference signal. Moreover, said bandwidth is not affected by the mixer 108 which, thus, leads to that the bandwidth of the VCO frequency is half the bandwidth of the reference signal. Since also the multiplier 118, having a multiplication factor 2, is connected, the bandwidth and frequency of the VCO frequency will be doubled. Thus, when the multipliers 115, 118 are connected, transmitted RF signals having the same modulated bandwidth in two frequency bands, are obtained.

To provide the second processing unit 111 in the feedback loop of the phase locked loop 104 in accordance with the invention means that the synthesizer 112 can be used upon transmission for both frequency bands and, consequently, only one VCO is needed in the transmitter. The VCO frequency for GSM900 is equal to transmitted RF signals in GSM900, i.e. 890–915 MHz. To mix down these frequencies to 117 MHz, a frequency working range of 1007–1032 MHz is needed for the synthesizer 112. However, the VCO frequency for PCS1900 is 925–955 MHz and, due to the fact that the multiplier 115 is connected when these frequencies are to be generated, only one intermediate frequency of 156/2=78 MHz has to be obtained upon down-mixing in the mixer 108 which gives an intermediate frequency of 156 MHz after the multiplier 115. With a desired intermediate frequency of 78 MHz and VCO frequencies of 925–955 MHz, the frequency working range 1003–1033 MHz is needed for the synthesizer 112. Thus, one and the same synthesizer 112 can be used upon transmission in two frequency bands.

An alternative embodiment is to let the processing units 114, 111 be implemented with frequency dividers instead of multipliers 115, 118. Then, the transmitter operates in a manner in analogy with what has been explained in connection with FIG. 1. However, the difference is that when the lower frequency band is to be transmitted, the frequency dividers are connected, while the frequency dividers are by-passed upon transmission in the higher frequency band.

Figure 2:
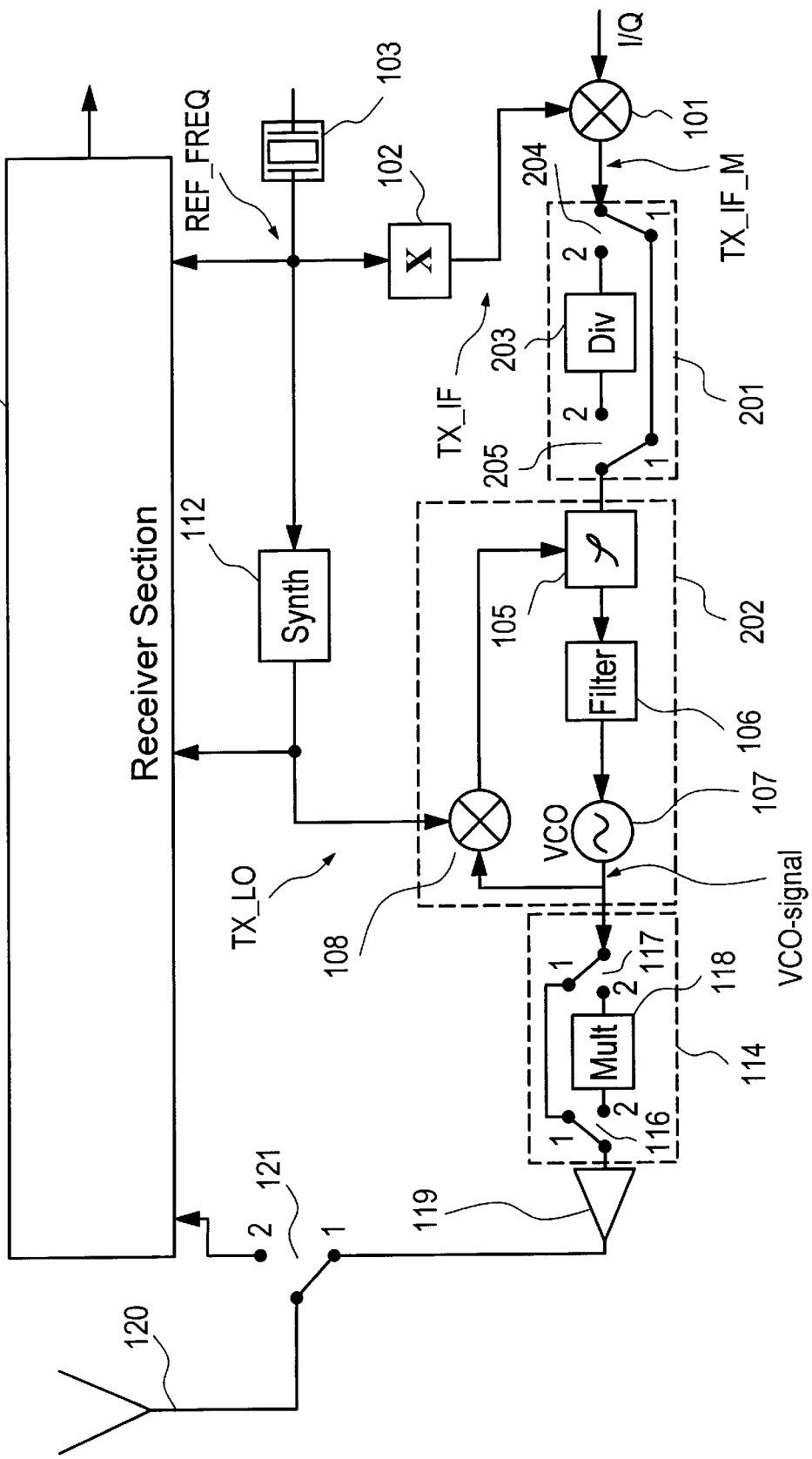
FIG. 2 shows another embodiment of the invention.

Another alternative embodiment is shown in FIG. 2. A phase locked loop 202 is not provided with any processing unit 111 in its feedback loop. Instead, a second processing unit 201, e.g. a frequency switching unit, is provided between the quadrature modulator 101 and the phase detector 105. The processing unit 201 can e.g. be implemented by means of a frequency divider 203 and two switches 204, 205. The switches 204, 205 are in a position 1 when the first frequency band is to be transmitted, and in a position 2 when the second frequency band is to be transmitted. When the switches 204, 205 are in the position 1, the modulated intermediate frequency TX_IF_M from the quadrature modulator 101 is supplied to the phase detector 105. When the switches 204, 205 are in the position 2, the modulated intermediate frequency TX_IF_M from the quadrature modulator 101 divided by a factor k, for example k=2, is supplied to the phase detector 105. Thus, the input signal to a phase detector will be half the modulated intermediate frequency TX_IF_M and half its modulation bandwidth. When the modulated intermediate frequency TX_IF_M divided by two is input signal to the phase detector 105, also the VCO signal will have a modulated bandwidth corresponding to half the modulated intermediate frequency TX_IF_M. Upon connection of the multiplier 118, the frequency of the VCO signal and its modulated bandwidth will be doubled. Then, the RF signal again has the same modulated bandwidth as the intermediate frequency signal TX_IF_M.

Another further embodiment is to replace the multiplier 118 with a frequency divider, and to replace the frequency divider 203 with a multiplier in the transmitter described in connection with FIG. 2. When the lower frequency band is to be transmitted, the frequency divider and the frequency multiplier are connected, while the frequency dividers are by-passed upon transmission in the higher frequency band. Above this, this embodiment functions in analogy with the embodiment in FIG. 2.

Figure 3:
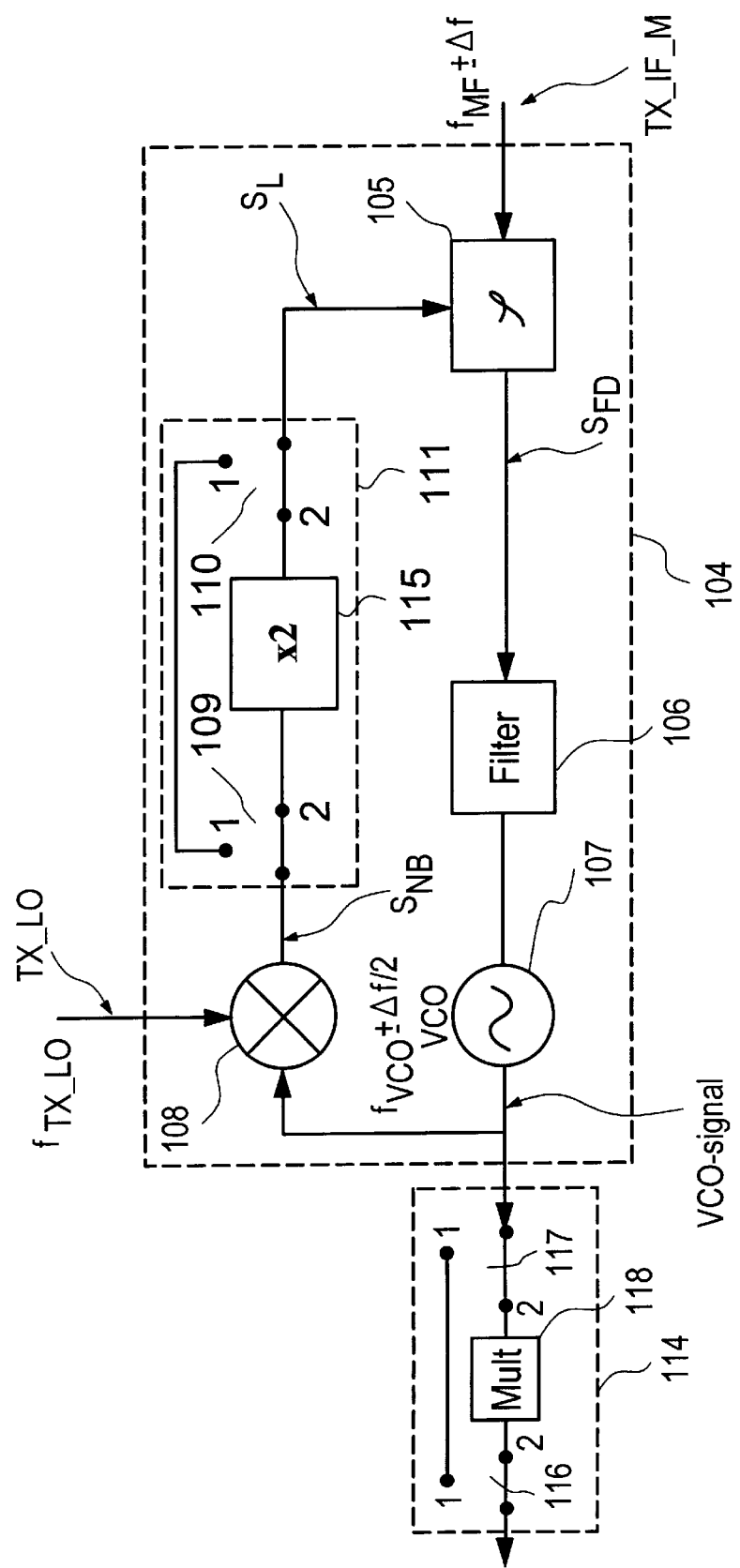
FIG. 3 is a block diagram of a phase locked loop in which a processing unit is provided.

FIG. 3 is a block diagram of the phase locked loop 104 which comprises a frequency multiplier 115 having a multiplication factor 2. The switches 109, 110 are in the position 2, while the switches 116, 117 in the processing unit 114 are in position 2, which means that the transmitter is to transmit RF signals in the second frequency band. The frequency of the signal TX_LO is determined to fTX_LO Hz in order for the phase locked loop 104 to generate a VCO frequency of fVCO Hz. The reference signal TX_IF_M is an independent signal supplied to the phase detector 105, where the signal has the intermediate frequency fMF and the modulation bandwidth ±Df, which modulation bandwidth comprises information intended for transmission. The feedback signal SL, where SL=fL±DfL, is also supplied to the phase detector 105. In accordance with a previously known method, the phase detector 105 generates an output signal SFD=VO±Dv which is dependent on the difference between the reference signal TX_IF_M and the feedback signal SL. The signal SFD is filtered in the filter 106, e.g. a low pass filter, whereupon a filtered signal controls the VCO 107. The control condition of the phase detector 105 is: TX_IF_M= SL, i.e. that fMF=2*(fTM_LO−fVCO) and that Df=DfL, which means that SL=2*( fTM_LO−fVCO)±Df. Since this relationship exists, it means that a down-mixed VCO signal SNB equals (fTM_LO−fVCO)±Df/2, which in its turn means that the VCO signal equals fVCO±Df/2. Hereby, it has thus now been shown that by connecting the multiplier 115 in the feedback loop of the phase locked loop 104, the VCO signal is obtained with a modulated bandwidth which is half as large as the reference signal TX_IF_M. Then, the bandwidth is recreated by connecting a further multiplier 118 in the RF part of the transmitter as has been explained before in connection with FIG. 1. Other embodiments operate in an analogous manner.

Of course, the invention is not restricted to the embodiments described above and illustrated on the drawing, but can be modified within the scope of the appended claims.

What is claimed is:

1. An apparatus for transmitting radio frequency (RF) signals in at least a first frequency band or a second frequency band, each having a fixed center frequency, where the center frequencies are related by a factor (k), comprising:

a modulator for generating a modulated intermediate frequency from a base band signal, a phase locked loop for generating a modulated voltage controlled oscillator (VCO) frequency in the radio frequency range from said modulated intermediate frequency, said phase locked loop comprising a VCO and a mixer, adapted to generate a mixed-down modulated VCO frequency, a phase detector, adapted to compare the modulated intermediate frequency with a reference signal which is dependent on said mixed-down modulated VCO frequency, a control signal being generated for controlling said VCO, adapted to generate the modulated VCO frequency, and a first processing unit, adapted to generate an RF signal which corresponds to said VCO frequency corresponding to said first frequency band or which corresponds to said VCO frequency multiplied by said factor corresponding to said second frequency band, wherein said phase locked loop further comprises a second processing unit to generate said reference signal which corresponds to the modulated fixed-down VCO frequency corresponding to said first frequency band or which corresponds to the modulated mixed-down VCO frequency multiplied by said factor (k) corresponding to said second frequency band.

2. The apparatus of claim 1, wherein the center frequency of a first frequency band is lower than the center frequency of the second frequency band, said factor (k) being greater than one.

3. The apparatus of claim 2, wherein the processing units comprise frequency multipliers.

4. The apparatus of claim 3, wherein the center frequency of the first frequency band is substantially two times lower than the center frequency of the second frequency band.

5. The apparatus of claim 1, wherein the center frequency of the first frequency band is higher than the center frequency of the second frequency band, said factor (k) being less than one.

6. The apparatus of 5, wherein the processing units comprise frequency dividers.

7. The apparatus of claim 6, wherein the center frequency of the first frequency band is substantially twice as high as the center frequency of the second frequency band.

8. An apparatus for transmitting radio frequency (RF) signals in at least a first frequency band or a second frequency band, each having a fixed center frequency, where the center frequencies are related by a factor (k), comprising:

a modulator for generating a modulated intermediate frequency from a base band signal, a phase locked loop for generating a modulated voltage controlled oscillator (VCO) frequency in the radio frequency range from a reference signal, a first processing unit adapted to generate an RF signal which corresponds to said VCO frequency corresponding to said first frequency band or which corresponds to said VCO frequency multiplied by said factor (k) corresponding to said second frequency band, and a second processing unit provided between said modulator and the phase locked loop to generate said reference signal which corresponds to the modulated intermediate frequency signal corresponding to said first frequency band or which corresponds to the modulated intermediate frequency signal divided by said factor (k) corresponding to said second frequency band.

9. The apparatus of claim 8, wherein a center frequency of the first frequency band is lower than the center frequency of the second frequency band, said factor (k) being larger than one.

10. The apparatus of 9, wherein the first processing unit comprises a frequency multiplier and the second processing unit comprises a frequency divider.

11. The apparatus of claim 8, wherein the center frequency of the first frequency band is substantially two times lower than the center frequency of the second frequency band.

12. The apparatus of claim 8, wherein the center frequency of the first frequency band is higher than the center frequency of the second frequency band, said factor (k) being less than 1.

13. The apparatus of claim 11, wherein the first processing unit comprises a frequency divider, and the second processing unit comprises a frequency multiplier.

14. The apparatus of claim 12, wherein the center frequency of the first frequency band is substantially twice as high as the center frequency of the second frequency band.

* * * * *